(12) United States Patent
Leuschner et al.

(10) Patent No.: US 7,075,807 B2
(45) Date of Patent: Jul. 11, 2006

(54) MAGNETIC MEMORY WITH STATIC MAGNETIC OFFSET FIELD

(75) Inventors: Rainer Leuschner, Samoreau (FR); Daniel Braun, Paris (FR); Gill Yong Lee, Boissise-le-Roi (FR); Ulrich Klostermann, Fontainebleau (FR)

(73) Assignees: Infineon Technologies AG, Munich (DE); Altis Semiconductor, Corbell Essonnes Cedex (FR)

( * ) Notice: Subject to any disclaimer, the term of this patent is extended or adjusted under 35 U.S.C. 154(b) by 32 days.

(21) Appl. No.: 10/920,562

(22) Filed: Aug. 18, 2004

(65) Prior Publication Data

US 2006/0038211 A1 Feb. 23, 2006

(51) Int. Cl.
*H01L 29/82* (2006.01)

(52) U.S. Cl. ............................ 365/48; 365/50; 365/55; 365/69; 365/98; 365/171; 365/173; 257/422

(58) Field of Classification Search ..................... None
See application file for complete search history.

(56) References Cited

U.S. PATENT DOCUMENTS

| 6,545,906 | B1 | 4/2003 | Savtchenko et al. | |
|---|---|---|---|---|
| 2002/0167059 | A1* | 11/2002 | Nishimura et al. | 257/421 |
| 2003/0002330 | A1* | 1/2003 | Nishimura | 365/158 |
| 2004/0257075 | A1* | 12/2004 | An et al. | 324/303 |
| 2005/0174692 | A1* | 8/2005 | Miyauchi et al. | 360/135 |

\* cited by examiner

*Primary Examiner*—Ngân V. Ngô
(74) *Attorney, Agent, or Firm*—Dicke, Billig & Czaja, PLLC

(57) ABSTRACT

A magnetoresistive or magnetic memory element and a magnetic random access memory having one or more magnetic memory elements. The memory element includes a magnetic tunnel junction including first and a second magnetic layers. The first magnetic layer having a free magnetization. The free magnetization of the first magnetic layer is magnetically coupled to a first current line and a second current line for switching the free magnetization, and a mechanism for applying a static magnetic offset field in the direction of at least one of the first and second current lines.

19 Claims, 1 Drawing Sheet

MAGNETIC MEMORY WITH STATIC MAGNETIC OFFSET FIELD

FIELD OF THE INVENTION

This invention is in the field of non-volatile semiconductor memory chips, and more particularly, relates to magnetoresistive memory elements and a magnetic random access memory (MRAM) chip comprising said memory elements for use in a semiconductor integrated circuit, and process for the preparation of such magnetoresistive memory elements.

BACKGROUND

Magnetic (or magneto-resistive) random access memory (MRAM) is a non-volatile access memory technology that could potentially replace dynamic random access memory (DRAM) as the standard memory for computing devices. Particularly, the use of MRAM-devices as a non-volatile RAM will eventually allow for "instant on" systems that come to life as soon as the computer system is turned on, thus saving the amount of time needed for a conventional computer to transfer boot data from a hard disk drive to volatile DRAM during system power-up.

A magnetic memory element (also referred to as a tunneling magneto-resistive or TMR-device) includes a structure having ferromagnetic layers separated by a non-magnetic layer (barrier) and arranged into a magnetic tunnel junction (MTJ). Digital information is stored and represented in the magnetic memory element as directions of magnetization vectors in the ferromagnetic layers. More specifically, the magnetic moment of one ferromagnetic layer is magnetically fixed or pinned (also referred to as a "reference layer"), while the magnetic moment of the other ferromagnetic layer (also referred to as "free layer") is free to be switched between the same and opposite directions with respect to the fixed magnetization direction of the reference layer. The orientations of the magnetic moment of the free layer are also known as "parallel" and "anti-parallel" states, respectively, wherein a parallel state refers to the same magnetic alignment of the free and reference layers, while an anti-parallel state refers to opposing magnetic alignments therebetween.

Depending upon the magnetic states of the free layer (i.e. parallel or anti-parallel states), the magnetic memory element exhibits two different resistance values in response to a voltage applied across the magnetic tunnel junction barrier. The particular resistance of the TMR-device thus reflects the magnetization state of the free layer, wherein resistance is "low" when the magnetization is parallel, and "high" when the magnetization is anti-parallel. Accordingly, a detection of changes in resistance allows a MRAM-device to provide information stored in the magnetic memory element, that is to say to read information from the magnetic memory element. In addition, a magnetic memory element is written to through the application of a bi-directional current in a particular direction, in order to magnetically align the free layer in a parallel or anti-parallel state.

An MRAM-device integrates a plurality of magnetic memory elements and other circuits, such as a control circuit for magnetic memory elements, comparators for detecting states in a magnetic memory element, input/output circuits and miscellaneous support circuitry. As such, there are certain microfabrication processing difficulties to be overcome before high capacity/density MRAM-devices become commercially available. For example, in order to reduce the power consumption of the MRAM-device and provide a variety of support functions, CMOS-technology is used. Various CMOS processing steps are carried out at relatively high temperatures, while ferromagnetic materials employed in the fabrication of MRAM-devices require substantially lower process temperatures. Thus, the magnetic memory elements are designed to be integrated into the back end wiring structure of back-end-of-line (BEOL) CMOS processing following front-end-of-line (FEOL) CMOS processing.

To be useful in electronic devices, very high density arrays, of magnetic memory cells are utilized in magnetic random access memories. In these high density arrays, the magnetic cells are generally arranged in rows and columns. Individual cells are addressable for reading and writing operations by the selection of an appropriate row and column containing the desired cell. Also, conveniently orthogonal current lines are provided, one for each row and one for each column, so that a selected cell is written by applying current to the appropriate row current line and the appropriate column current line.

Recently, and especially in view of modem portable equipment, such as portable computers, digital still cameras and the like, the demand of low-cost and high-density mass storage memories has increased dramatically. Therefore, one of the most important issues for low-cost and high-density NRAM-devices is a reduction of the MRAM-cell size. However, down-scaling MRAM-cells requires smaller and smaller magnetic tunnel junctions and, therefore, a lot of problems can arise. For a given aspect ratio and free layer thickness, the activation energy is dependent on the free layer volume scales down, like w, where w is the width of the magnetic cell. Otherwise, the switching fields increase roughly, like 1/w. Thus, in scaling down MRAM-cells field selected switching becomes ever harder, but at the same time the magnetic cell looses its information more and more rapidly due to thermal activation. A major problem with having a small activation energy (energy barrier) is that it becomes extremely difficult to selectively switch one MRAM-cell in an array. Selectability allows switching without inadvertently switching other MRAM-cells.

In general, if a magnetic field in the direction opposite to the magnetization direction of the free layer is applied in the direction of the easy axis of the magnetization, then the magnetization direction is reversed to the direction of the applied magnetic field at a critical magnetic field value, which is also referred to as reversal magnetic field. The value of the reversal magnetic field can be determined from a minimum energy condition. If a magnetic field is applied not only in the direction of the easy axis of magnetization but also in the direction of the hard axis of magnetization, then the absolute value of the reversal magnetic field decreases. In particular, where the magnetic field applied to the direction of the hard axis of magnetization is represented by $H_x$ and the magnetic field applied to the direction of the easy axis of magnetization is represented by $H_y$, then a relationship $H_x^{(2/3)} + H_y^{(2/3)} = H_c^{(2/3)}$ is established, where Hc represents the anisotropic magnetic field of the free layer. Since this curve forms an asteroid on the $H_x$-$H_y$-plane, it is called an asteroid curve. As can be seen from the above relationship, a composite magnetic field enables the selection of a single NRAM-cell positioned at an intersection of word and bit lines in the position where only the sum of both magnetic fields at least amounts to the reversal magnetic field.

A typical switching mechanism used for switching MRAM-cells is the well-known "Stoner-Wohlfahrt"-switching scenario, in which magnetic anisotropy of the free layer is chosen to be approximately parallel to a wafer surface. In particular, writing into an MRAM-cell is performed by controlling the magnetization direction of the free layer using a composite magnetic field generated by supplying current to both of a word line and a bit line. Another method of switching an MRAM-cell is the well-known "adiabatic rotational switching"-scenario, in which magnetic anisotropy of the free layer is chosen to be inclined under an angle of about 45° relative to the wafer surface. The rotational switching mechanism is, for example, disclosed in U.S. Pat. No. 6,545,906 B1 to Savtchenko et al., the disclosure of which is incorporated herein by reference. One key difference between Stoner-Wohlfarth-switching and adiabatic rotational switching is that the latter one uses only unidirectional fields.

In light of the above, it is an object of the invention to provide a magnetic memory element and magnetic random access memory (MRAM) device comprising such magnetic memory elements allowing a cell-size down-scale without thereby causing severe problems as to an increase of switching-fields and decrease of activation energy.

SUMMARY

The present invention provides a magnetoresistive or magnetic memory element and a magnetic random access memory having one or more magnetic memory elements. In one embodiment, the memory element includes a magnetic tunnel junction including first and second magnetic layers. The first magnetic layer having a free magnetization. The free magnetization of the first magnetic layer is magnetically coupled to a first current line and a second current line for switching the free magnetization, and a mechanism for applying a static magnetic offset field in the direction of at least one of the first and second current lines.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
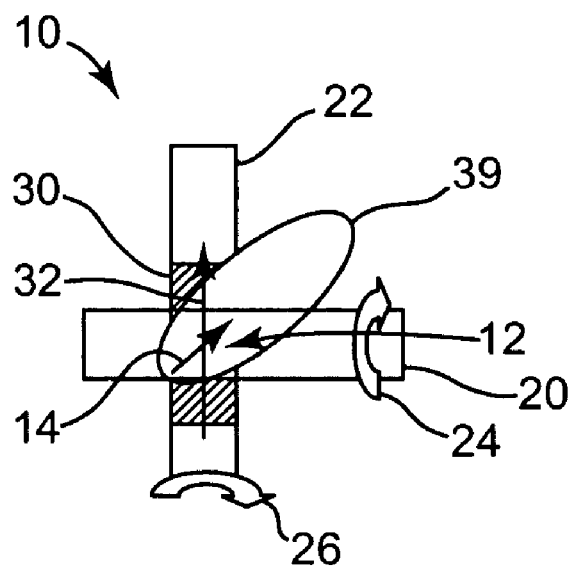
FIG. 1 is a schematic top-down view illustrating one embodiment of the magnetoresistive memory element of the invention.

FIG. 1 is a schematic top-down view illustrating an embodiment of a magnetic (i.e., magnetoresistive) memory element 10 of the invention. One or more embodiments of the magnetic memory element of the invention are explained in the following paragraphs.

In one embodiment, based on a magnetic memory cell with first and second current lines along word lines and bit lines, respectively, the magnetic memory element 10 comprises a magnetic tunnel junction (MTJ) 12 illustrated by its easy axis 14, which includes free and reference layers (not illustrated) made of a magnetic material stacked in parallel, overlying relationship and separated by a layer of nonmagnetic material. The magnetization of the free layer is magnetically coupled to a first current line 20 above the MTJ 12 and a second current line 22 below the MTJ 12 for its switching in a parallel or anti-parallel state with respect to the magnetization of the reference layer. First current line 20 and second current line 22 are crossing at a right angle, while the MTJ 12 is positioned at the intersection. First current line 20 generates a first magnetic field 26 when a current is sent therethrough. Also, second current line 22 generates a second magnetic field 26 when a current is sent therethrough. Both magnetic fields 22, 26 mutually act on the easy axis 14 magnetization of the MTJ 12 for its switching. Partially surrounding the second current line 20 below the MTJ 12, a ferromagnetic liner 30 made of a ferromagnetic material is arranged for providing a static magnetic offset field 32 (magnetic dipole field) directed in the direction of the second current line 22, and also, directed in the direction of the magnetic field of the first current line 20. Due to the static magnetic offset field 32, in switching magnetic memory element 10, magnetic writing field 24 of the first current line 20 can be reduced, without negatively affecting activation energy of the magnetic memory element 10.

Figure 2:
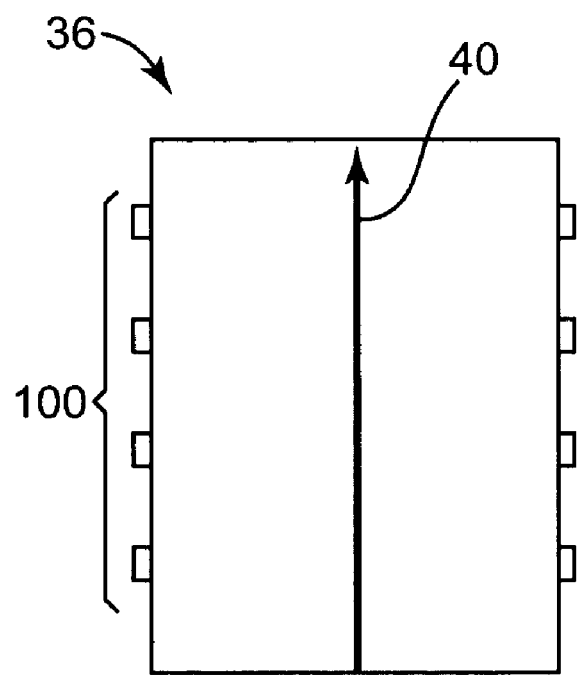
FIG. 2 is a schematic illustration of a static magnetic offset field of another embodiment of the invention.

FIG. 2 is a schematic diagram illustration of the static magnetic offset field of another embodiment of the invention. FIG. 2 schematically illustrates a magnetic random access memory chip 36 comprise a plurality of magnetic memory elements 38, similar to magnetic memory element 10 previously described, each of which comprising a magnetic tunnel junction including first and a second magnetic layers made of magnetic material stacked in parallel, overlying relationship and separated by a layer of nonmagnetic material. The magnetic random access memory chip 36 further comprises a magnetic shielding layer for applying a static magnetic offset field 40 in the direction of one of the first and second current lines. The static magnetic offset field 40 is chosen to be a magnetic dipole field.

In light of the above, it is an object of the invention to provide a magnetic memory element and magnetic random access memory (MRAM) device comprising such magnetic memory elements allowing a cell-size down-scale without thereby causing severe problems as to an increase of switching-fields and decrease of activation energy.

The above object can be attained by a magnetoresistive memory element according to embodiments of the present invention. In one embodiment, the memory element 10 comprises a magnetic tunnel junction 12 and first and second current lines 20, 22, which are crossing at right angles, while each magnetoresistive memory element 10 typically is positioned at an intersection of first and second current lines 20, 22. The magnetoresistive tunnel junction (MTJ) 12 includes first and a second magnetic layers made of magnetic material stacked in parallel, overlying relationship and separated by a layer of nonmagnetic material. As typical, the second magnetic layer is provided with a magnetically fixed (pinned) magnetization, while the first magnetic layer is provided with a "free" magnetization, that is to say, which is free to be switched between the same and opposite directions with respect to the fixed magnetization direction of the second magnetic layer. The free magnetization of the first magnetic layer is magnetically coupled to the first and second current lines for switching of the free magnetization.

According to one embodiment of the invention, the memory element 10 further comprises one or more means for applying a static magnetic offset field 32, 40 in the direction of at least one of the first and second current lines 20, 22. Superposing a static magnetic offset field 32 in the direction of at least one of the first and second current lines 20, 22 advantageously allows to reduce the magnetic field (reversal magnetic field) that has to be generated by the currents. Hence, writing currents of an MRAM-cell according to the invention can be reduced.

Moreover, while a static magnetic offset field in the easy axis direction of the magnetization of the free layer would have a problem that the activation energy may be decreased, such that the free layer will get unstable, the static magnetic offset field 32, 40 of the present invention allows to maintain or even increase the activation energy. Most of the time the information is just stored and no switching field is applied. If the activation energy would be reduced, as in the case of a static magnetic field in easy axis direction of the magnetization of the free layer, might get lost due to thermally activated switching. Hence, with maintained or even increased activation energy there is less of a risk for unintended magnetization reversal in the storage case.

The static magnetic offset field 32, 40 may be chosen to be a nearly homogeneous magnetic field. Alternatively, it may be chosen to be a magnetic dipole field.

According to the invention, it may be preferred that the means for applying a static magnetic field is for applying a static magnetic offset field 32, 40 in the direction of only one of said first and second current lines. In one embodiment on an MRAM-array having first and second current lines crossing at right angles, the static magnetic offset field 32, 40 directed in one of the first or second current lines 20, 22 thus is directed in the same direction as the magnetic field of the other one of the first or second current lines 20, 22.

In one embodiment of the invention, the above-cited mechanism or means for applying a static magnetic offset field 32, 40 is embodied to be at least one ferromagnetic liner 30, i.e., one or more ferromagnetic liners 30, made of ferromagnetic material, positioned adjacent at least one of the first and second current lines 20, 22. In other words, the ferromagnetic liner(s) 30 may be provided at the first current line 20, the second current line 22 or both. In case the ferromagnetic liner(s) 30 are arranged at only one of the first and second current lines 20, 22, only the current for one current line will be reduced, but this is the current of the current line that has no ferromagnetic liner and therefore has a low current-efficiency. The other current line has the ferromagnetic liner(s) 30 and therefore a high current efficiency, which means that for this current line the current is already low.

The ferromagnetic liner(s) 30 may particularly be positioned to be in contact with the first and/or second current lines 20, 22. The ferromagnetic liner(s) 30 may be positioned on the top and/or on the bottom and/or on one side and/or on both sides of the current line, seen in a direction away from the surface of a wafer on which the memory cell typically is formed. It especially may be preferable, if the ferromagnetic liner 30 is formed to have a U-shaped profile, as seen in cross-section through the corresponding current line. It typically is relatively easy to build a U-shaped ferromagnetic liner 30 for a current line, which is below the MTJ, but may be more difficult to build the ferromagnetic liner 30 for the current line above the MTJ, since in the latter case, a up-side down U-shaped profile has to be manufactured. Therefore, one preferred embodiment is to have only one ferromagnetic liner for the current line below the MTJ. The other current line above the MTJ can then profit from the reduced magnetic field requirement due to the static magnetic offset field 32 from the current line below the MTJ.

The ferromagnetic liner(s) 30 in the magnetoresistive memory element 10 according to the invention has a magnetic anisotropy along the direction of the at least one of said first and second current lines 20, 22. The magnetic anisotropy may be realized by shape anisotropy and/or intrinsic anisotropy. It also may be preferred if the ferromagnetic liner 30 is segmented having cuts perpendicular to the direction of the at least one of said first and second current lines 20, 22. In that case, shape anisotropy may be realized by segments, each having a length that is larger than its width, wherein the length is the segment's dimension in the direction of the at least one of the first and second current lines 20, 22, and wherein the width is the segment's dimension perpendicular to the direction of the at least one of the first and second current lines 20, 22.

According to another embodiment of the invention, the means for applying a static magnetic offset field is an additional ferromagnetic layer of the stacked magnetic tunnel junction. Such additional ferromagnetic layer may be positioned at the bottom of the stacked magnetic tunnel junction or may also be positioned within the MTJ-stack. Independent from the magnetic anisotropy of free and reference layers of the MTJ-stack, which in case adiabatic rotation is used for switching typically is inclined under an angle of about 45° relative to the wafer surface on which the memory element is formed, the magnetization of the additional ferromagnetic layer 30 for providing a static magnetic offset 32 field may be directed to the direction of the first or second current lines 20, 22 by using intrinsic magnetic anisotropy.

In one embodiment, the invention further comprises a magnetic random access memory chip 36, which comprises a plurality of magnetic memory elements 10 as above-described.

In one embodiment, the invention comprises a magnetic random access memory chip 36 having a plurality of magnetic memory elements 10, each of which comprising a magnetic tunnel junction 12 including first and a second magnetic layers made of magnetic material stacked in parallel, overlying relationship and separated by a layer of nonmagnetic material, the second magnetic layer being provided with a magnetically fixed magnetization, while the first magnetic layer being provided with a free magnetization being free to be switched between the same and opposite directions with respect to the fixed magnetization direction of the second magnetic layer, the free magnetization of said first magnetic layer being magnetically coupled to a first current line 20 and a second current line 22 for switching said free magnetization. Such magnetic random access memory chip 36 according to the invention is provided with a magnetic shielding layer in a chip packaging for applying a static magnetic offset field 40 in the direction of at least one of said first and second current lines 20, 22. Such static magnetic offset field 32 preferably is chosen to be a magnetic dipole field. Furthermore preferred, the static magnetic field is directed in the direction of only one of the first and second current lines.

In the magnetoresistive memory element 10 of the present invention, switching currents of the magnetic memory element can advantageously be reduced by applying a static magnetic offset field 32, 40 directed to the direction of one or both of first and second current lines 20, 22, while the activation energy for switching the memory elements 10 is kept or even increased, such that the storage stability of the memory elements will not be affected or is even improved. Hence, an increase of writing currents upon scaling-down of the memory elements may be avoided or even a decrease of writing currents may be achieved. Using Stoner-Wohlfahrt-switching for switching of magnetoresistive memory elements 10 of the present invention, write margins will be reduced. Alternatively, using adiabatic rotation for switching of magnetoresistive memory elements 10 of the present invention, write fields will be reduced. Accordingly, adiabatic rotation for switching of the magnetoresistive memory elements 10 of the present invention is highly preferred.

A ferromagnetic liner 30 being formed in U-shape may be processed in the following way: Forming of a trench; depositing of a liner material; filling of the trench with a photoresist; exposing with a mask with lines running perpendicular to the direction of the trench, to make discrete elements out of the ferromagnetic liner; developping of the photoresist; etching out of the liner material in the resist trenches; removal of the photoresist; filling of the trenches with conductive material, such as copper.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A magnetoresistive memory element comprising:
a magnetic tunnel junction including a first magnetic layer and a second magnetic layer made of magnetic material stacked in a parallel, overlying relationship and separated by a layer of nonmagnetic material, the second magnetic layer being provided with a magnetically fixed magnetization, while the first magnetic layer being provided with a free magnetization being free to be switched between the same and opposite directions with respect to the fixed magnetization direction of the second magnetic layer, the free magnetization of said first magnetic layer being magnetically coupled to a first current line and a second current line for switching said free magnetization; and
at least one mechanism for applying a static magnetic offset field in the direction of at least one of said first current line and second current line.

2. The memory element of claim 1, wherein the static magnetic offset field is a nearly homogeneous magnetic field.

3. The memory element of claim 1, wherein the static magnetic offset field is a magnetic dipole field.

4. The memory element of claim 1, wherein mechanism for applying a static magnetic field applies a static magnetic offset field in the direction of one of the first and second current lines.

5. The memory element of claim 1, wherein the mechanism for applying a static magnetic offset field comprises at least one ferromagnetic liner made of ferromagnetic material adjacent at least one of the first and second current lines, the ferromagnetic liner having a magnetic anisotropy along the direction of the at least one of the first and second current lines.

6. The memory element of claim 5, wherein the ferromagnetic liner is segmented having cuts substantially perpendicular to the direction of the at least one of the first and second current lines.

7. The memory element of claim 1, wherein the at least one ferromagnetic liner is positioned to be in contact with the at least one of the first and second current lines.

8. The memory element of claims 5, wherein the ferromagnetic liner is formed to have a U-shaped cross-sectional profile.

9. The memory element of claim 1, wherein the mechanism for applying a static magnetic offset field is an additional ferromagnetic stacking layer of the stacked magnetic tunnel junction.

10. A magnetic random access memory chip comprising:
a plurality of magnetic memory elements according to the magnetoresistive memory element of claim 1.

11. A magnetic random access memory chip comprising:
a plurality of magnetic memory elements, each of which comprising a magnetic tunnel junction including first and a second magnetic layers made of magnetic material stacked in parallel, overlying relationship and separated by a layer of nonmagnetic material, the second magnetic layer being provided with a magnetically fixed magnetization, while the first magnetic layer being provided with a free magnetization being free to be switched between the same and opposite directions with respect to the fixed magnetization direction of the second magnetic layer, the free magnetization of the first magnetic layer being magnetically coupled to a first current line and a second current line for switching the free magnetization;
and a magnetic shielding layer in a chip packaging for applying a static magnetic offset field in the direction of at least one of the first and second current lines.

12. The magnetic random access memory chip of claims 11, wherein the static magnetic field is directed in the direction of one of the first and second current lines.

13. The magnetic random access memory chip of claim 11, wherein the static magnetic offset field is a magnetic dipole field.

14. The magnetic random access memory chip of claim 12, a static magnetic field directed in the direction of one of the first and second current lines.

15. A magnetic memory comprising:
a magnetic tunnel junction;
a first current line and a second current line; and
at least one mechanism for applying a static magnetic offset field in the direction of at least one of the first current line and the second current line, wherein the mechanism for applying a static magnetic offset field comprises at least one ferromagnetic liner made of ferromagnetic material adjacent at least one of the first and second current lines, the ferromagnetic liner having a magnetic anisotropy along the direction of the at least one of the first and second current lines.

16. The memory element of claim 15, wherein the ferromagnetic liner is segmented having cuts substantially perpendicular to the direction of the at least one of the first and second current lines.

17. The memory element of claim 16, wherein the at least one ferromagnetic liner is positioned to be in contact with the at least one of the first and second current lines.

18. The memory element of claims 17, wherein the ferromagnetic liner is formed to have a U-shaped cross-sectional profile.

19. The memory element of claim 18, wherein the mechanism for applying a static magnetic offset field is an additional ferromagnetic stacking layer of the stacked magnetic tunnel junction.

* * * * *